United States Patent [19]

Alvino et al.

[11] 4,327,143

[45] Apr. 27, 1982

[54] MOISTURE RESISTANT LAMINATES IMPREGNATED WITH AN IMPREGNATING COMPOSITION COMPRISING EPOXY RESIN AND A DICYANDIAMIDE DERIVATIVE

[75] Inventors: William M. Alvino, Penn Hills; Janet L. Hammill, King of Prussia; Martin P. Seidel, Monroeville, all of Pa.

[73] Assignee: Westinghouse Electric Corp., Pittsburgh, Pa.

[21] Appl. No.: 228,016

[22] Filed: Jan. 23, 1981

[51] Int. Cl.$^3$ .................. B32B 7/00; H05K 1/00; C09J 5/02; B05D 3/02
[52] U.S. Cl. ........................ 428/236; 156/307.4; 156/307.5; 156/330; 174/68.5; 427/386; 427/389.9; 427/394; 428/248; 428/251; 428/901; 427/385.5
[58] Field of Search ............ 428/236, 248, 249, 251, 428/414, 415, 416, 417, 418, 901; 427/385.9, 389.9, 386, 394; 174/68.5; 156/307.5, 307.4, 330

[56] References Cited

U.S. PATENT DOCUMENTS

| | | | |
|---|---|---|---|
| 2,801,672 | 8/1957 | Baldwin et al. | 428/246 |
| 3,732,286 | 5/1973 | Son et al. | 260/37 EP |
| 3,759,914 | 9/1973 | Simms et al. | 260/37 EP |
| 3,895,158 | 7/1975 | Gause | 174/68.5 |
| 4,076,869 | 2/1978 | Flynn | 427/386 |

OTHER PUBLICATIONS

Kitagawa, C, "Studies on Dicyanodiamide (First Report) on the Condensation Reaction with Formaldehyde", *Journal of the Society of the Chemical Industry (Japan)*, 45, 416–419 (1942).

*Primary Examiner*—William R. Dixon, Jr.
*Attorney, Agent, or Firm*—D. P. Cillo

[57] ABSTRACT

A resin impregnated, B-staged sheet material free of crystal formations, useful for metal clad and unclad laminate production, is made by impregnating a sheet containing a resin comprising epoxy resin and an amount of curing agent effective to cure the epoxy resin to the C-stage, where the curing agent consists essentially of the reaction product of dicyandiamide and an aminophylic reagent selected from the group consisting of aldehydes, alkyl monoglycidyl ethers having the formula:

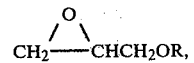

where R=an alkyl group having from 1 to 4 carbon atoms, styrene oxide, ethylene oxide, propylene oxide, acetic anhydride, benzoyl chloride, acetyl chloride, and mixtures thereof, and then heating the impregnated sheet until the resin is in the B-stage.

15 Claims, 4 Drawing Figures

MOISTURE RESISTANT LAMINATES IMPREGNATED WITH AN IMPREGNATING COMPOSITION COMPRISING EPOXY RESIN AND A DICYANDIAMIDE DERIVATIVE

BACKGROUND OF THE INVENTION

Dicyandiamide is a well known nonpolymeric amide. If has found use in many applications, including fertilizers, pharmaceutical products, explosives, soldering compositions and fire-proofing compounds. Resin-like products can be produced by reacting dicyandiamide with formaldehyde to form a methylol derivative, as taught by Kitakawa, in the *Journal of the Society of Chemical Industry*, (Japan), 45, 416-419 (1942).

Son et al., in U.S. Pat. No. 3,732,286, taught acylguanidine catalyzed dicyandiamide and dicyandiamide type curing agents for epoxy resins. One of the many materials encompassed by the Son et al. curing agent general formula would include monomethylol dicyandiamide. The acylguanidine is used to lower the reaction temperature of cure. These materials are useful as potting resins, coatings and adhesives. Simms et al., in U.S. Pat. No. 3,759,914, in a patent similar to Son et al., taught a wide variety of amide catalyzed amine curing agents, for epoxy resins, to provide compositions useful as impregnants, potting and encapsulating compositions, powder coatings, surface coatings and in laminates and fillers, but primarily as adhesives for metals. The amine curing agents used include dicyandiamide, monomethylol dicyandiamide, benzoguanamine, melamine, adipamide, isophthalyl diamide and triaminomelamine, among twenty-five others listed. These compositions used from 0.1% to 300% amide catalyst based on the weight of amine curing agent, to lower the reaction temperature of the curing agents. Some of these epoxy compositions would still require extended heating times, and others would provide soft materials upon cure. Simms et al. lumps all of these amine curing agents together and recognizes no problems with dicyandiamide or any of the others in the manufacture of epoxy resin impregnated glass cloth laminates for multilayer printed wiring boards, where very strict military specifications are applicable in the areas of moisture resistance and cosmetic defects.

Additional uses for dicyandiamide have been found, for example, as a curing agent for phenol-aldehyde resins, as described by Baldwin et al., in U.S. Pat. No. 2,801,672, and as a curing agent for epoxy resins used in the preparation of glass cloth prepregs for printed circuit boards, as described, for example, by Gause et al., in U.S. Pat. No. 3,895,158. In Gause et al., a laminate is formed by disposing a resin impregnated layer of cellulose fiber paper between layers of glass fiber fabric sheets impregnated with a resin comprising epoxy resin and dicyandiamide, and then heat-pressure bonding the layers together.

However, dicyandiamide is relatively insoluble in epoxy resins at room temperature, and has limited solubility in low boiling organic solvents as well as water, which are commonly used to dilute the epoxy resins. Thus, there are limits on the amount of epoxy solids that can be used in the impregnating solution. Also, the large amount of solvent used to solubilize the dicyandiamide, results in long heat treating times, in order to remove all of the solvent so that no gas bubbles are formed in laminates impregnated with the epoxy-dicyandiamide system. This large amount of solvent is completely evaporated in processing, and poses a very substantial economic loss.

In addition, straight epoxy-dicyandiamide systems, if not carefully controlled, can precipitate dicyandiamide crystals during B-staging. These crystal formations are randomly disposed, and can be seen at the laminate surface. The crystals have a needlelike shape, ranging from 1 mm. to 10 mm. in length. They are in fact potential air pocket voids. During final cure to the C-stage, crystal formations which are actually voids occur due to the reabsorption during press lamination of dicyandiamide crystals which initially came out of solution at the prepreg stage. This crystallization and void formation leads to lowering of the moisture resistance of laminates impregnated with the epoxy-dicyandiamide system, due to the resin starved areas at the crystallization sites.

These problems have led to a search for a curing agent that has increased solubility in epoxy resins and water, allowing high solids content and use of less solvent, and which requires less heat treating time and also resists crystallization during B-stage prepreg heating and high temperature-pressure laminate molding of impregnated glass cloth laminates.

SUMMARY OF THE INVENTION

The above need has been met and the above problems solved, by providing a B-staged glass cloth sheet material impregnated with epoxy resin and an amount of a curing agent effective to C-stage the epoxy, the curing agent having a unique ability to solve moisture and crystallization problems in the B-staged sheet and the laminated product. The curing agent is a dicyandiamide derivation reaction product of dicyandiamide and an aminophylic reagent. By the term "aminophylic reagent" is meant, a reagent that is attracted by $NH_2$ groups. The aminophylic reagent can be selected from aldehydes, ketones, alkyl monoglycidyl ethers, styrene oxide, alkylene oxides, non cyclic anhydrides and acyl chlorides.

These modified dicyandiamide curing agents are useful with an epoxy resin system to provide an insulation material which can be impregnated into glass cloth or glass fabric suitable substrates. Suitably formulated epoxy resin systems using this curing agent can have high water solubility and high solids, and will exhibit substantially no dicyandiamide crystal formations upon heating to the B-stage or upon lamination. The term "crystal formations" is herein defined as including crystals and resin-starved voids at the crystallization site. Epoxy resin systems using this curing agent were found to require substantially less solvent and treating time. The useful weight ratio of dicyandiamide derivative:solvent is between about 1:4 to 7 when an epoxy resin is used without a diluent and between about 1:2 to 7 when an epoxy resin is used with a diluent. These epoxy resin systems can be impregnated into woven glass cloth for use as core layers for laminates particularly useful as printed circuit boards.

BRIEF DESCRIPTION OF THE DRAWINGS

For a better understanding of the invention, reference may be made to the preferred embodiments exemplary of the invention, shown in the accompanying drawings, in which.

DESCRIPTION OF THE PREFERRED EMBODIMENTS

In accordance with the present invention, a laminate is made from B-staged core sheets containing a highly moisture resistant resin system, comprising epoxy resin and a modified dicyandiamide curing agent in solution. The curing agent is a dicyandiamide derivation reaction product of dicyandiamide and an aminophylic reagent. The aminophylic reagent is selected from the group consisting of aldehydes such as formaldehyde and the like, ketones such as acetone and the like, alkyl monoglycidyl ethers where alkyl equals from $C_1$ to $C_4$, styrene oxide, alkylene oxides such as ethylene oxide and the like, non-cyclic anhydrides such as acetic anhydride and the like, and acyl chlorides such as benzoyl chloride and the like. These modified dicyandiamide curing agents are useful with an epoxy resin to provide a cured, moisture resistant insulation material. The preferred aminophylic reagent is an aldehyde and the most preferred aldehydes are formaldehyde and paraformaldehyde.

The body of the preferred high pressure laminate of this invention can be made using a core consisting solely of modified epoxy resin impregnated woven glass fabric, or by sandwiching at least one layer of paper, cotton, or other sheet material between outer layers of modified epoxy resin impregnated woven glass fabric. Laminates utilizing these cores provide combination of properties that make them outstanding substrates for thin metallic printed circuit boards.

Metal foil, such as copper or aluminum, may be bonded directly to one or both of the outer woven glass layers during the fabrication of the laminate, preferably without separate adhesive layers, to conveniently form metal clad laminates useful for printed circuitry. The dicyandiamide derivative curing agents of this invention will be primarily described in terms of their most useful form, i.e., as curing agents for epoxy resin impregnated, glass cloth or glass fabric core sheets in copper clad laminates, where the laminates have thicknesses of from about 1/32 to ⅛ inch.

Lightweight, electrical and high pressure laminating grade glass fabrics may be employed as core sheets, to be impregnated with the modified dicyandiamide-epoxy resin described herein. Such fabrics are available in a plain weave of continuous filaments, in a variety of styles and finishes, generally varying in thickness from about 2 to 14 mils and from about 1.2 to 18 oz./sq. yd. in weight. Any finish on the glass should be compatible with the resin system employed.

Figure 1:
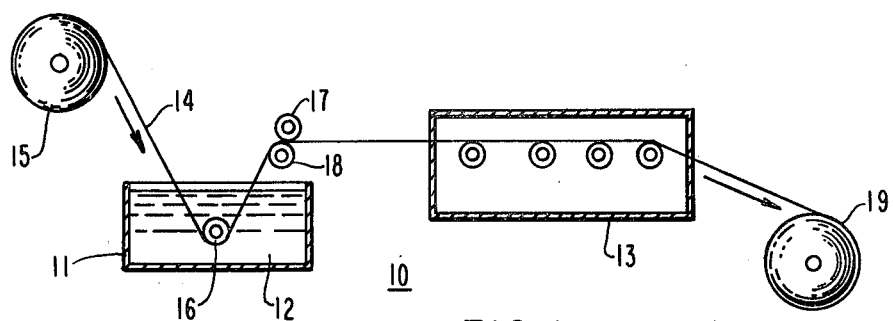
FIG. 1 is a schematic illustration of the treatment of sheet material with the impregnating composition of this invention, to provide a B-staged resin impregnated sheet material.

Referring now to FIG. 1 of the drawings, there is illustrated a treater 10 comprising a tank 11 containing a modified dicyandiamide epoxy resin impregnant solution 12 and an oven 13. Woven glass fabric 14 is taken off of the pay-off reel 15 and passed into the resin tank 11 where it is held immersed in the impregnant 12 by the roll 16. Emerging from the tank, the fabric passes between the rolls 17 and 18 which remove excess resin solution, to provide a resin content of at least about 35% by weight based on the total dry weight of the fabric. The impregnated fabric is then directed into the oven 13. In the oven, it is heated to remove solvent and cause the resin to partially cure to a non-tacky but fusible stage which is dry to the touch, and capable of flow and final curing upon application of heat, herein defined as the "B-stage". During heating, usually at a temperature of between about 110° C. and about 150° C., the solvent present in the resin solution is evaporated, to provide a resin content in the fabric of between 25% and 60% by weight based on the total dry weight of the fabric.

The heating is conducted so that the resulting impregnated material has a "greenness" of from about 0.5% to about 15%. The greenness is determined by placing several pieces of the resin treated sheet material in a hot press at a temperature of 175° C. and a pressure of 1,000 pounds per square inch for 5 minutes, and then measuring the amount of resin that is forced out of the sample, that is, the resin that extends beyond the fibrous sheet material proper, and determining the proportion of this exuded resin to all of the resin in the sample. After cooling, the B-stage resin impregnated material or prepreg is wound onto the take-up reel 19.

Among suitable epoxy resins are those popularly known as diglycidyl ether of bisphenol A, DGEBA, epoxies, i.e., those derived from the reaction of epichlorohydrin and bisphenol A in an alkaline medium. Other dihydric phenols may be used in combination with or in substitution for the bisphenol A. Epoxy novolacs may also be employed in partial or complete substitution for the bisphenol epoxies. The novolacs are prepared by reacting epichlorohydrin with phenol-formaldehyde condensates. In addition to phenol, alkyl phenols may be employed. Acetaldehyde, butyraldehyde and furfuraldehyde, for example, may be used in place of formaldehyde. These epoxy resins have viscosities over 250 cps. generally over about 500 cps. at 25° C.

Chlorinated phenols and chlorinated aldehydes may be used to impart flame resistance to the cured product. Indeed, chlorinated and particularly brominated epoxies are effectively employed to impart the flame resistance required by GF and FR grade laminates. Antimony trioxide, certain phosphates and other flame retarding additives may also be included in the impregnant to impart an additional degree of fire or flame resistance to the product.

Effective amounts of epoxy diluents, such as the diglycidyl ether of a glycol having from 2 to 12 carbon atoms in the glycol unit, for example, the diglycidyl ether of neopentyl glycol; as well as 1,4-butanediol diglycidyl ether; butyl glycidyl ether; bis (2,3-epoxy-2-methyl propyl) ether; 1,2-epoxy-3-phenoxy propane and the like, can be used to provide high solids, low viscosity impregnating solutions. These epoxy diluents, having a low viscosity, i.e., between about 5 cps. and about 200 cps. at 25° C., can act as a co-solvent to some extent for the dicyandiamide derivative, cutting down on the amount of solvent required for their dissolution. The useful weight ratio of epoxy resin:epoxy diluent is from about 1:0 to 0.35, i.e., up to about 35 parts of diluent can be used per 100 parts of epoxy resin.

Organic solvents, such as methyl cellosolve, ethyl cellosolve, acetone, methyl ethyl ketone, methyl isobutyl ketone, dimethylformamide, and the like, employed as a medium to react the dicyandiamide and the aminophylic reagent, and to provide a solution of dicyandiamide derivative. The liquid impregnating composition will include the modified dicyandiamide-curing agent of this invention in solution, to enable or aid the epoxy to first advance to the fusible B-stage and then later to completely cure to the infusible or C-stage. Reactivity after B-staging should be sufficiently limited so that the wound substrate is not significantly advanced during any storage conditions or time. The use of a dicyandiamide derivative will allow a substantial savings in the expensive solvent used and ultimately lost, since all of the dicyandiamide derivatives described herein are more soluble than dicyandiamide in the solvents, such as methyl cellosolve, described above. The solubility of monomethylol dicyandiamide in methyl cellosolve, for example was found to be about 20 wt.%, a weight ratio of dicyandiamide derivative:solvent of about 1:5 at 25° C. By contrast, the solubility of dicyandiamide in methyl cellosolve is about 6 wt.%, a weight ratio of dicyandiamide:solvent of about 1:16.

It should also be understood that in the treating operation, the resin will penetrate into the interstices and also coat the fibers of the sheet. This applies to both the inner and outer layers. Small effective amounts of catalysts, about 0 wt.% to about 2.0 wt.% based on the weight of the modified dicyandiamide curing agent, may also be added to allow faster B-staging of the impregnated substrate. Useful catalysts include amines such as tertiary amines, for example, benzyldimethylamine, triethylamine, pyridine, quinoline, pyrazine and the like, and imidazoles, for example, imidazole, 1 methyl imidazole, 2 methyl imidazole and the like. Alkali compounds, soluble in the admixture of epoxy and modified dicyandiamide, such as potassium carbonate, tetramethyl ammonium hydroxide and the like, may also be used as accelerators.

The paper sheet, which may constitute part of the core, is preferably made from water-laid cellulose fibers which have preferably been treated or fibrillated to provide a high degree of bonding between the fibers in the sheet and, therefore, provide sufficient strength so the sheet can be continuously treated without auxiliary support.

The fibers generally run from about 0.5 to 5 mm. in average length. Mixtures of hardwood and softwood fibers may be employed, and the various known pulping processes may be used in preparing these paper sheets which may constitute a part of the core for the laminates of this invention. Other cellulose fibers such as cotton linter cellulose fibers may also be water-laid to provide high strength sheets and may also be employed.

The cellulose fiber paper may be treated with phenolic resins and/or epoxy resins, in the manner described hereinabove for the woven glass fabric, to provide sheets impregnated with B-staged resin. With the epoxy impregnated paper, however, an anhydride curing agent such as chlorendic anhydride is preferred to the modified dicyandiamide employed with the woven glass cloth. Water absorption may be further enhanced by first treating the cellulose paper sheets if used, with a low solids phenolic resin methanol-water solution to open the sheet, B-staging the phenolic resin and then treating the sheet with the anhydride catalyzed epoxy resin in a second pass through the treater.

The modified dicyandiamide curing agent for the epoxy resins described hereinabove is the reaction product of one of the two following reactions:

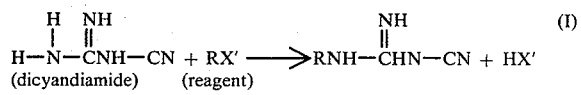

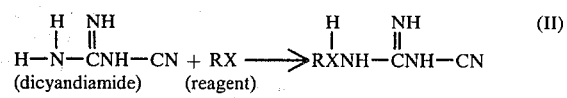

where the reagent RX or RX' is an organic aminophylic reagent such as:
RX' = non-cyclic anhydride or acyl chloride, and
RX = aldehyde, ketone, alkyl monoglycidyl ether, styrene oxide or alkylene oxide.

The mole ratio of dicyandiamide:aminophylic reagent is generally about 1:1. In some instances, the reaction product of dicyandiamide with RX' = formaldehyde will dimerize upon heating, forming a longer chain modified dicyandiamide. An effective amount of modified dicyandiamide to cure the epoxy is within an Equivalent Weight ratio of epoxy:modified dicyandiamide of between about 1:1 and 1:0.05, preferably between about 1:05 and 1:0.05.

Useful aminophylic reagents, attracted to react with the NH$_2$ group of dicyandiamide, are selected from: aldehydes, preferably formaldehyde, paraformaldehyde, acetaldehyde, propionaldehyde, acrolein and the like and their mixtures, where it is understood that the terms "formaldehyde" and "acetaldehyde" mean aqueous solutions of those compounds; ketones, preferably acetone; alkyl monoglycidyl ethers of the formula:

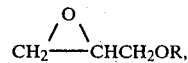

where R = an alkyl group preferably having from 1 to 4 carbon atoms; styrene oxide; alkylene oxides, preferably ethylene oxide, propylene oxide and their mixtures; non-cyclic anhydrides, preferably acetic anhydride and acyl chlorides, preferably benzoyl chloride, acetyl chloride and their mixtures.

The most preferred aminophylic reagent is formaldehyde, which reacts with dicyandiamide under specific conditions according to the equation:

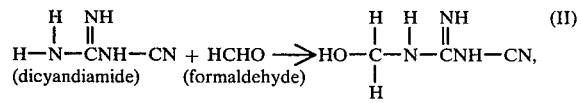

where the reaction product consists essentially of N-cyano-N'-hydroxymethyl guanidine, i.e., monomethylol dicyandiamide. Paraformaldehyde provides the same product. This dicyandiamide derivative can be isolated as a substantially pure powder product which can be added to solvent and epoxy resin. The dicyandiamide derivative can also be prepared in-situ without actually isolating the product, by mixing a solvent such as methyl cellosolve with dicyandiamide, aminophylic reagent, and some alkali for about 15 to about 30 minutes at about 75° C.

The useful weight ratio of dicyandiamide derivative curing agent:solvent required to dissolve it is between about 1:4 to 7. When an epoxy diluent is used with the epoxy resin, the diluent also can help dissolve some of the dicyandiamide derivative, and the useful weight ratio of dicyandiamide derivative curing agent: solvent is between about 1:2 to 7. Thus, use of these modified dicyandiamide curing agents allows about a 3× savings in expensive solvent, reduction of pollution problems, and reduction of treating time.

Figure 2:
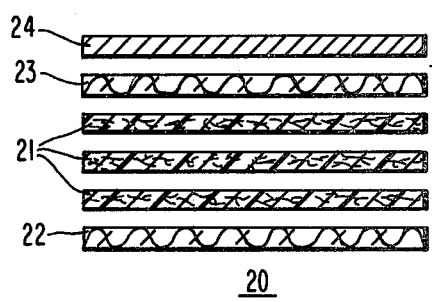
FIG. 2 is a schematic view of an assembly of sheets constituting a stack-up for a high pressure laminate.

Referring now to FIG. 2 of the drawings, a stack-up assembly 20 is composed of one or more paper, cotton, or other core sheets 21, surface sheets 22, 23 of a woven glass fabric and a metal foil, preferably one ounce per square foot copper foil sheet 24. The surface sheets are treated to a resin ratio (weight of solid B-staged resin to weight of the sheet without resin) of about 1.3 to about 2.5, i.e., a resin content of from about 25 wt.% to about 60 wt.%. The stack-up, together with a polyvinyl fluoride separator sheet on the side opposite the copper foil, is placed between pressing plates and inserted into a press having heated platens and cured at a pressure from about 500 psi. to 1,500 psi. at about 150° C. to 200° C. for 1 to 1½ hours. After that time period the resins will be advanced to the C-stage to form the unitary heat and pressure consolidated, completely cured high pressure metal foil clad laminate illustrated in FIG. 3.

Figure 3:
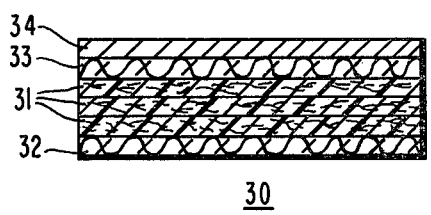
FIG. 3 is a cross-sectional view of one embodiment of a unitary, consolidated high pressure laminate in accordance with this invention, suitable as a printed circuit board.
Figure 4:
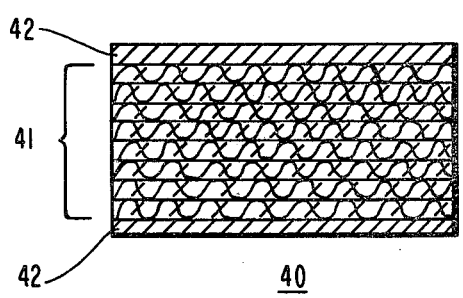
FIG. 4 is a cross-sectional view of another embodiment of a unitary, consolidated high pressure laminate in accordance with this invention, suitable as a printed circuit board.

In FIG. 3, there is illustrated a unitary, bonded composite circuit board 30 comprising resin impregnated paper, cotton or other sheets 31, sandwiched between woven glass cloth outer layers 32 and 33, impregnated with a resin comprising an epoxy resin and an amount of a modified dicyandiamide curing agent effective to cure the epoxy resin, and a metal foil, preferably a copper cladding 34. FIG. 4 shows a unitary, bonded composite circuit board 40, consisting solely of a woven glass fabric core 41, impregnated with a modified dicyandiamide-epoxy resin, and a metal foil, preferably a copper cladding 42.

A separate catalyzed adhesive layer may be deposited on a catalyzed or uncatalyzed unclad laminate so that metal layers may be plated onto the entire surface or onto selected portions thereof in a predetermined circuit pattern. Aluminum foil may be used in place of copper foil. It may be useful to employ a sacrificial aluminum foil layer with a phosphoric acid anodized surface to provide an improved bonding surface for additive circuits. As is well known, an electrodeless copper strike may be first deposited on the catalyzed surfaces, including the catalyzed or sensitized surfaces of through holes, and thicker copper or other conductive metals may be deposited over the strike. The laminates of this invention may be advantageously employed in a variety of printed circuit fabricating techniques.

All of the B-staged or laminated products made using the modified dicyandiamide-epoxy resin described hereinabove will have substantially no air pocket crystallization voids. In addition, a higher solids content is obtainable due to the improved solubility of the modified dicyandiamide in epoxy resins, and this additionally guards against voids caused by evaporation of the large amounts of solvent present during B-staging in conventional systems.

EXAMPLE 1

A high solids, low solvent impregnating resin system was made from epoxy resin, brominated bisphenol A, epoxy diluent, and a methyl cellosolve solution of N-cyano-N'-hydroxymethyl guanidine curing agent. The modified dicyandiamide curing agent was first prepared. To a 250 cc. three neck round bottom Pyrex glass flask equipped with a stirrer, thermometer and condenser, were added: 42 grams (0.50 mole) dicyandiamide; 15 grams (0.50 mole) formaldehyde, i.e., 40.5 grams of a 37 wt.% formalin solution, where the formalin solution was adjusted to a pH of 8.8 by adding 1 N sodium hydroxide; and 50 ml. of distilled water. The mixture was heated to 76° C. and held at that temperature for ½ hour, after which it was cooled to about 25° C. A clear colorless solution was provided. The solution was filtered and the filtrate concentrated under nitrogen gas. About 42 grams of a white solid was obtained having a melting point of 115° C. to 118° C. Elemental analysis found: C=31.50 wt.%, H=5.30 wt.%, N=49.18 wt.% and O=13.92 wt.%. These results indicated.

The epoxy resin was then prepared. To a 1,000 cc. three neck round bottom Pyrex glass flask equipped with a stirrer, thermometer and nitrogen gas inlet, were added: 417.54 grams of a liquid diglycidyl ether of bisphenol A epoxy resin having an epoxy equivalent weight of 193 to 203 and a viscosity at 25° C. of 3,000 to 7,000 cps. (sold commercially by Shell Chemical Co. under the Tradename Epon 829); and 182.46 grams of tetrabromobisphenol A. The mixture was heated to 90° C. and then cooled to about 25° C. A clear amber viscous resin was obtained having an epoxide equivalent weight of 274, as determined by the pyridinium chloride method. To this epoxy resin were added five different low viscosity epoxy diluents, in a weight ratio of epoxy resin:epoxy diluent of 1:0.25, to provide five formulations having 100% epoxy solids and viscosities ranging from 400 cps. to 3,200 cps. at 39° C.

To 40 grams of each of these epoxy+epoxy diluent formulations, was added an amount of N-cyano-N'-hydroxymethyl guanidine curing agent needed to cure the total epoxy, as shown below in Table I. The solid N-cyano-N'-hydroxymethyl guanidine curing agent was dissolved in methyl cellosolve and then added to the formulations. The solids were calculated, and the viscosity at 30° C. and set times at 153° C. were measured, as shown below in Table I:

TABLE 1

| Formulation* | Diluent | Grams of Curing Agent | EQUIV. WT. Epoxy:Curing Agent | WT. RATIO Curing Agent: Solvent | Calculated Solids | Viscosity 30° C. | Set Time 153° C. |
|---|---|---|---|---|---|---|---|
| 1 | 1,4-butanediol-diglycidyl ether | 3.70 | 1:0.23 | 1:2 | 86 wt. % | 1,400 cps. | 13 min. |
| 2 | diglycidyl ether of neopentyl glycol | 3.62 | 1:0.22 | 1:2 | 86 wt. % | 2,000 cps. | 14 min. |
| 3 | butyl glycidyl ether | 3.71 | 1:0.23 | 1:2 | 86 wt. % | 600 cps. | 18 min. |
| 4 | bis (2,3-epoxy-2-methyl propyl) ether | 3.13 | 1:0.16 | 1:2 | 87 wt. % | 2,400 cps. | 25 min. |
| 5 | 1,2-epoxy-3-phenoxy | 3.57 | 1:0.21 | 1:2 | 86 wt. % | 680 cps. | 30 min. |

TABLE 1-continued

| Form- ula- tion* | Diluent | Grams of Cur- ing Agent | EQUIV. WT. Epoxy:Curing Agent | WT. RATIO Curing Agent: Solvent | Calcu- lated Solids | Viscosity 30° C. | Set Time 153° C. |
|---|---|---|---|---|---|---|---|
| | propane | | | | | | |

*40 grams = 80 wt. % Epon 829 + tetrabromobisphenol A and 20 wt. % diluent.

The formulations, having high solids, low viscosity, and a short set time, would be ideal impregnating compositions for a wide variety of porous sheet substrates, such as cotton, paper or glass fabric. If dicyandiamide were used instead of the N-cyano-N'-hydroxymethyl guanidine in the formulations of Table I, about three to four times more solvent would be needed to obtain dissolution, and the solids contents of these formulations would only range from about 64% to about 67%, as compared to the average of 86% solids for the formulations described above. These high resin formulations, consisting of epoxy resin, brominated epoxy resin, epoxy diluent, curing agent reaction product of dicyandiamide and an aminophylic reagent, and a minor amount of solvent would find excellent application as an impregnant for substrates used as a base for metallic printed circuitry.

EXAMPLE 2

B-staged glass fabric sheets and completely cured laminates were made. A high solids, low solvent impregnating resin system was made as follows, using equipment described in Example 1. To a 1,000 cc. flask were added: 3.77 grams (0.045 mole) dicyandiamide; 27.84 grams of methyl cellosolve; and 1.40 grams (0.046 mole) formaldehyde, i.e., 3.77 grams of a 37 wt.% formalin solution, where the admixture was adjusted to a pH of 8.5 by adding 20 ml. of 1 N sodium hydroxide. This solution was stirred and heated for 1 hour at 75° C., after which it was cooled to about 55° C. This provided a methyl cellosolve solution of N-cyano-N'-hydroxymethyl guanidine curing agent.

To this curing agent solution was then added 51.43 grams of tetrabromobisphenol A with mixing for 5 minutes. Then, 100 grams of Epon 829 liquid diglycidyl ether of bisphenol A epoxy, preheated to 55° C., was mixed onto the brominated epoxy-curing agent admixture for 10 minutes with sufficient heating to raise the temperature to about 45° C. This provided an impregnating composition having an EQUIV. WT. ratio of Epoxy:Curing Agent of about 1:0.5. Prior to use, a combination of optional accelerators were added to lower the time required for the composition to achieve the B-stage. Benzyldimethylamine, 0.45 grams, and a potassium carbonate solution containing 0.093 grams potassium carbonate and 0.186 grams deionized water were added to the cooled impregnating composition with stirring. The weight ratio of dicyandiamide curing agent:solvent was 1:5.4 for this system which did not use any epoxy diluent.

Using the same ratios and ingredients a larger batch was prepared. After two hours, the impregnating composition was poured into a resin bath, such as that shown in FIG. 1 of the Drawings. This impregnating composition had a viscosity at 25° C. of 814 cps., a solids content of about 76 wt.% and a set time at 153° C. of 14 minutes. A small amount of green dye was then added to the bath to give the composition a green color.

An A1100 finish glass fabric sheet material, having a thickness of 7 mils (0.007″), was passed through the resin bath and then between rolls to remove excess resin, after which it was passed at a rate of 400 inches/min. through a 25 ft. long treating tower oven operating at a temperature of between about 120° C. to 135° C. The impregnated glass fabric after exiting the oven was a green color, and had a resin content of about 50 wt.% based on the dry weight of the fabric, i.e. a resin ratio of 2.0. The resin impregnated glass fabric was non-tacky and dry to the touch, but fusible and not completely cured, i.e., B-staged. The greenness of the impregnated glass fabric was 7.2%.

A portion of one impregnated, B-staged sheet was examined under a 10× microscope and no crystal formations were observed. This sheet would pass military specification for semi-cured, resin-impregnated glass cloth. Eight cut sheets of the resin impregnated glass fabric sheet material were placed in a laminating press and heat and pressure consolidated 160° C. and 1,000 psi. After cooling and release, the laminated sheets (0.050 inch thick) were removed and the laminate top and bottom flat surfaces were examined under a 10× microscope and no crystal formations were seen. Additionally, the glass transition temperature of the resin was found to be 130° C. This impregnating composition produced a laminate that was highly moisture resistant and which would be an excellent support for copper or aluminum foil printed circuitry. B-staged glass fabric sheets using impregnant without accelerators, as in EXAMPLE 1, would produce equally outstanding void free laminates although the time required to B-stage would be longer.

In a similar fashion, 2.51 grams of paraformaldehyde was substituted for formaldehyde in the formulation described above. All the other ingredients were the same and a similarly useful modified dicyandiamide-epoxy impregnating composition was produced.

COMPARATIVE EXAMPLE 3

As a comparative example, B-staged glass fabric sheets and completely cured laminate were made using dicyandiamide alone as the curing agent. The same procedure and ingredients were used as in EXAMPLE 2, except no formalin or sodium hydroxide was added, the amount of methyl cellosolve used was 54.97 grams, and the dicyandiamide and methyl cellosolve were mixed for only 5 minutes at 35° C. before addition of the tetrabromobisphenol A, Epon 829, benzyldimethylamine and aqueous potassium carbonate solution. The impregnating composition, using dicyandiamide as sole curing agent had a very low viscosity at 25° C. of 114 cps., a solids content of about 72 wt.% and a set time at 153° C. of 15½ minutes. The weight ratio of dicyandiamide:solvent was 1:14.6.

Again, using the same ratios and ingredients, a larger batch was prepared and poured into a resin bath. An A1100 finish glass fabric sheet material having a thickness of 7 mils was passed through the resin bath and then between rolls to remove excess resin after which it was passed at a rate of 400 inches/min. through a 25 ft. long treating tower oven operating at a temperature of between about 120° C. to 135° C. The impregnated glass fabric after exiting the oven was a green color, and had a resin content of about 50 wt.% based on the dry weight of the fabric, i.e., a resin ratio of 2.0. The resin impregnated glass fabric was non-tacky and dry to the touch but fusible and not completely cured, i.e., B-staged. The greenness of the impregnated glass fabric was 13.7%.

A portion of one impregnated, B-staged sheet was examined under a 10× microscope and an abundance of white dicyandiamide crystals were seen. These crystals appeared as a "crowsfeet" configuration with needles, actually resin starved areas of from about 1 mm. to 4 mm. in length. Eight sheets of the resin impregnated glass fabric sheet material were placed in a laminating press and heat and pressure consolidated 160 ° C. and 1,000 psi. After cooling and release, the laminated sheets were removed and the laminate top and bottom flat surfaces were examined under a 10× microscope and the same amount of white crystals, now crystal formation voids were seen. These crystal formations result from the reabsorption during press lamination of the dicyandiamide crystals which initially come out of solution of the B-stage. Additionally, the glass transition temperature of the resin was found to be 129° C.

It was difficult to determine if the crystal formations had increased in length after lamination, but they certainly provided ample access for water both through the top surfaces and through the sides of the laminates. This example shows that dicyandiamide is not the equivalent of N-cyano-N'-hydroxymethyl uganidine in a B-staged glass fabric sheet or in a laminated printed circuit board, where moisture resistance is of prime importance. The N-cyano-N'-hydroxymethyl guanidine possesses unobvious and unexpected beneficial properties that are different from and not possessed by the dicyandiamide as regards not forming crystals during processing, to produce B-staged materials and laminates. If the modified dicyandiamide derivative would have been used, only about 18.5 grams of solvent would have been required, a 67% savings of expensive solvent and the crystals would never have formed. In addition, N-cyano-N'-hydroxymethyl guanidine allows the use of higher solids contents impregnating compositions, additionally eliminating solvent void formation during B-staging. Other aminophylic reagents, such as the ketones, alkyl monoglycidyl ethers, oxides, non-cyclic anhydrides and acyl chlorides, and use of other solvents as described herein, will provide equally water resistant B-staged sheet or laminates free of crystal formations.

We claim:

1. A process for producing a resin impregnated, B-staged glass fabric sheet material free of crystal formations, comprising the steps of:
   (A) impregnating glass fabric material with a low solvent resin system comprising an epoxy resin and an amount of curing agent, in organic solvent solution, effective to cure the epoxy resin to the C-stage, the curing agent consisting essentially of the reaction product of dicyandiamide and an aminophylic reagent selected from the group consisting of aldehydes, ketones, alkyl mono glycidyl ethers having the formula:

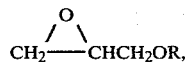

where R=an alkyl group having from 1 to 4 carbon atoms, acetone, styrene oxide, ethylene oxide, propylene oxide, acetic anhydride, benzoyl chloride, acetyl chloride, and mixtures thereof, where the weight ratio of curing agent: organic solvent is between about 1:4 to 7,
   (B) removing excess resin from the glass fabric material, and
   (C) heating the impregnated glass fabric material to remove solvent and to partially cure it and form a B-staged sheet where said B-staged sheet is free of crystal formation.

2. The process of claim 1, wherein the curing agent consists essentially of N-cyano-N'-hydroxymethyl guanidine.

3. The process of claim 1, where heating during step (C) is between about 110° C. and about 150° C., to provide a resin content in the sheet of between about 25% and 60% by weight based on the total dry weight of the sheet.

4. The process of claim 1, where up to about 35 parts by weight of epoxy diluent per 100 parts by weight of epoxy resin is included in the resin system, and the weight ratio of curing agent:organic solvent is between about 1:2 to 7.

5. The process of claim 1, wherein the greeness of the resin-impregnated sheet material is from about 0.5% to about 15%, and where a plurality of cut, resin-impregnated sheets are stacked on top of each other, and consolidated under heat and pressure into a unitary, bonded laminate free of crystal formations.

6. The process of claim 4 where the epoxy resin has a viscosity of over 250 cps. at 25° C. and the epoxy diluent has a viscosity of between 5 cps. and 200 cps. at 25° C.

7. A resin impregnated, B-staged glass fabric material, suitable as a core sheet for a printed circuit board, the resin comprising an epoxy resin and an amount of curing agent effective to cure the epoxy resin to the C-stage, the curing agent consisting essentially of N-cyano-N'-hydroxymethyl guanidine, where the greenness of the resin impregnated glass fabric is from about 0.5% to about 15% and the B-staged sheet is free of crystal formations.

8. A plurality of cut, resin impregnated B-staged sheet material of claim 7 stacked on top of each other, and consolidated under heat and pressure into a unitary, bonded laminate free of crystal formations.

9. The stacked sheet materials of claim 8 also having at least one metal foil outer layer, to provide a unitary, bonded circuit board having at least one metal foil outer layer.

10. A resin impregnated, heat and pressure consolidated, completely cured circuit board, comprising a stack-up assembly of a plurality of sheets bonded together, where at least the surface sheets of the laminate are glass fabric impregnated with a resin comprising an epoxy resin and an amount of curing agent effective to cure the epoxy resin to the C-stage, the curing agent consisting essentially of the reaction product of dicyandiamide and an aminophylic reagent selected from the group consisting of aldehydes, alkyl mono glycidyl ethers having the formula:

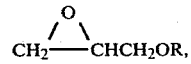

where R=an alkyl group having from 1 to 4 carbon atoms, acetone, styrene oxide, ethylene oxide, propylene oxide, acetic anhydride, benzoyl chloride, acetyl chloride, and mixtures thereof, said laminate being free of crystal formations.

11. The laminate of claim 10, wherein the aminophylic reagent is an aldehyde.

12. The laminate of claim 10, wherein at least one cellulose paper sheet is disposed between the cured epoxy resin impregnated sheets.

13. The laminate of claim 10, wherein all the sheets are epoxy resin impregnated glass fabric sheets, and the laminate also has at least one metal foil outer layer.

14. A resin impregnated, heat and pressure consolidated, completely cured, moisture resistant circuit board comprising a plurality of glass fabric sheets impregnated with a resin comprising an epoxy resin and an amount of curing agent effective to cure the epoxy resin to the C-stage, the curing agent consisting of N-cyano-N'-hydroxymethyl guanidine, said laminate being free of crystal formations.

15. The laminate of claim 14, wherein the laminate also has at least one metal foil outer layer.

* * * * *